United States Patent
Chhabra et al.

(10) Patent No.: US 7,475,314 B2
(45) Date of Patent: Jan. 6, 2009

(54) MECHANISM FOR READ-ONLY MEMORY BUILT-IN SELF-TEST

(75) Inventors: Pawan Chhabra, Bangalore (IN); Tessil Thomas, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 378 days.

(21) Appl. No.: 11/450,722

(22) Filed: Jun. 8, 2006

(65) Prior Publication Data

US 2007/0143650 A1    Jun. 21, 2007

(30) Foreign Application Priority Data

Dec. 15, 2005   (IN) .................... 3371/DEL/2005

(51) Int. Cl.
    G01R 31/28    (2006.01)
(52) U.S. Cl. ...................... 714/733; 714/718
(58) Field of Classification Search ............ 365/189.16, 365/189.07; 702/120; 714/719, 724, 733, 714/718

See application file for complete search history.

(56) References Cited

U.S. PATENT DOCUMENTS

| | | | |
|---|---|---|---|
| 5,241,500 A * | 8/1993 | Barth et al. ............ 365/189.16 |
| 6,081,910 A * | 6/2000 | Mifsud et al. ............... 714/718 |
| 6,768,685 B1 * | 7/2004 | Scheuerlein ........... 365/189.07 |
| 2005/0154552 A1 * | 7/2005 | Stroud et al. ................. 702/120 |
| 2005/0216799 A1 * | 9/2005 | Azimane ..................... 714/718 |

* cited by examiner

Primary Examiner—David Ton
(74) Attorney, Agent, or Firm—Blakely, Sokoloff, Taylor & Zafman LLP

(57) ABSTRACT

In one embodiment, a method for on-die read only memory (ROM) built-in self-test (BIST) is disclosed. The method comprises testing odd word line entries of a read-only memory (ROM) array by performing two passes through the ROM array to test each odd word line entry for static and delay faults, testing even word line entries of the ROM array by performing two passes through the ROM array to test each even word line entry for static and delay faults, and testing each entry of the ROM array for static faults masked by dynamic faults by performing two passes through the ROM array. Other embodiments are also described.

20 Claims, 9 Drawing Sheets

```
┌─────────────────────────────────────────────────────┐
│ Perform two passes for testing odd word line entries│──210
│ of a ROM array for static and delay faults          │
└─────────────────────────────────────────────────────┘
                         ↓
┌─────────────────────────────────────────────────────┐
│ Apply CRC to data retrieved from ROM in each pass   │──220
│ to determine whether any faults exist in ROM        │
└─────────────────────────────────────────────────────┘
                         ↓
┌─────────────────────────────────────────────────────┐
│ Perform two passes for testing even word line       │──230
│ entries of the ROM for static and delay faults      │
└─────────────────────────────────────────────────────┘
                         ↓
┌─────────────────────────────────────────────────────┐
│ Apply CRC to data retrieved from ROM in each pass   │──240
│ to determine whether any faults exist in ROM        │
└─────────────────────────────────────────────────────┘
                         ↓
┌─────────────────────────────────────────────────────┐
│ Perform two passes for testing each entry of the ROM│
│ for static faults masked by dynamic faults,         │──250
│ the first pass testing even word lines and the      │
│ second pass testing odd word lines                  │
└─────────────────────────────────────────────────────┘
                         ↓
┌─────────────────────────────────────────────────────┐
│ Apply CRC to data retrieved from ROM in each pass   │──260
│ to determine whether any faults exist in ROM        │
└─────────────────────────────────────────────────────┘
```

MECHANISM FOR READ-ONLY MEMORY BUILT-IN SELF-TEST

FIELD OF THE INVENTION

The embodiments of the invention relate generally to the field of built-in self-tests in computer systems and, more specifically, relate to a mechanism for read-only memory built-in self-tests.

BACKGROUND

Built-in self-tests (BIST) are typically performed to determine defective array structures in a chip. BISTs are utilized to test various types of memory. Typically, in a random access memory (RAM), a BIST can test for many types of faults. These faults can be broadly placed into four categories: (1) Stuck at faults; (2) Transition faults; (3) Coupling faults; and (4) Neighborhood Pattern Sensitive faults.

RAMs have both read and write ports. Therefore, these faults may be sensitized by writing specific data patterns to the RAM memory and reading out the same specific data patterns. The data that is read out can then be compared to the data that was read in to the memory to determine whether any faults exist. Faults in write/read address decoders, write/read word lines, and read data path circuits are also covered while testing for the above-mentioned faults in a BIST of RAM.

However, there is an important difference between a BIST for RAM and a BIST for a read-only memory (ROM) memory array. The ROM is a read-only structure and, therefore, generally only has read ports. Consequently, the ability for a BIST to provide a writing pattern to the ROM that can then be read out to test for special fault sensitizing patterns is not possible in a ROM memory.

ROM memory cells are hardwired to either power or ground depending on the content in the cell. As a result, stuck at faults are the most commonly occurring faults in the ROM memory cells. These stuck at faults may include: Stuck at Cell faults, Stuck at Word-Line faults, Stuck at Bit-Line faults, Stuck at Address Input Line faults, Stuck at Decoder faults, and Mixed Stuck at faults (a combination of above mentioned faults).

Other types of faults that may occur in a ROM, though less common, are Delay faults (back-to-back read may be one reason) and Power Voltage Sensitive faults. Furthermore, dynamic faults may occur in a ROM from read word lines or read data path circuits. As on-die ROMs normally operate at a full speed clock (e.g., microprocessor internal pipeline clock), these dynamic faults cannot be ignored.

Existing ROM BIST algorithms compress pre-silicon ROM content and store the compressed signature either in the same ROM or off-ROM. Then, during a power-on BIST of the chip, the contents are read out, compressed, and the results are compared with the pre-silicon signature. For conventional ROM BIST algorithms, this signature is calculated using a single way Cyclic Redundancy Check (CRC) algorithm. As a result, an escape probability for static faults compared to multi-way CRC signature algorithms is higher. Yet, conventional ROM BIST algorithms do not provide a robust way to test static faults in the ROM using the conventional hardware for ROM BIST.

Furthermore, reading out the contents of ROM post-silicon usually involves a simple shift register as a Read Side Test Register (RSTR) and a Linear Feedback Shift Register (LFSR) for compressing the serial data shifted out of the RSTR. As a result, every read cycle must be interleaved with multiple shift cycles so that compression can take place properly. Consequently, back-to-back reads cannot take place and, therefore, back-to-back read word line faults sensitization and read data path delay faults sensitization are not possible. The alternative to this is to use a Multiple Input Shift Register (MISR) as the RSTR. But, this is costly in terms of hardware. Existing algorithms for ROM BIST do not cover testing for dynamic faults using the conventional combination of a simple shift register as RSTR and LFSR for compressing.

BRIEF DESCRIPTION OF THE DRAWINGS

The invention will be understood more fully from the detailed description given below and from the accompanying drawings of various embodiments of the invention. The drawings, however, should not be taken to limit the invention to the specific embodiments, but are for explanation and understanding only.

FIG. 2 illustrates a flow diagram of one embodiment of a method for read-only memory (ROM) built-in self-test (BIST);

DETAILED DESCRIPTION

A mechanism for read-only memory (ROM) built-in self-test (BIST) is described. In the following detailed description of the invention, numerous specific details are set forth in order to provide a thorough understanding of the invention. However, it will be apparent to one skilled in the art that the invention may be practiced without these specific details. In other instances, well-known structures and devices are shown in block diagram form, rather than in detail, in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1B:
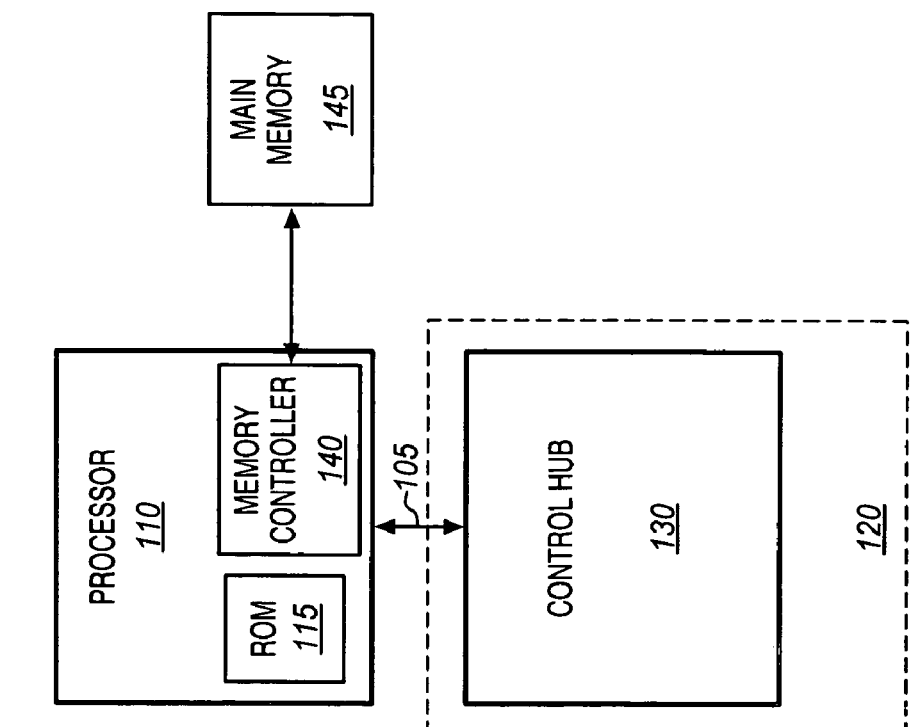
FIG. 1B illustrates a block diagram of another embodiment of a computer system.
Figure 1A:
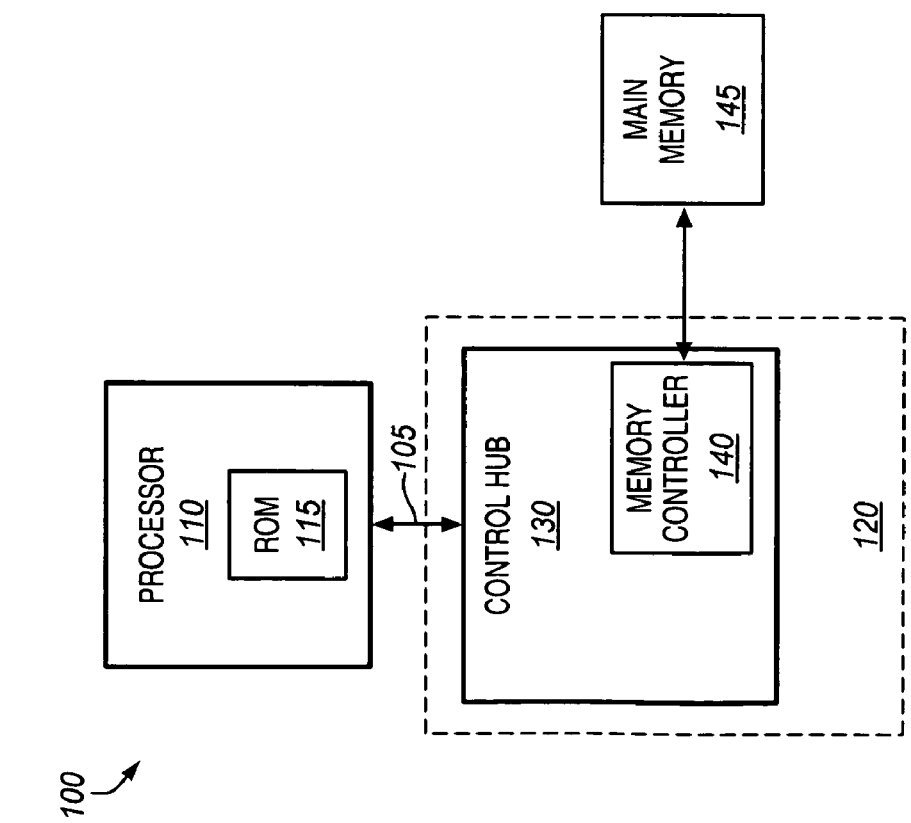
FIG. 1A illustrates a block diagram of one embodiment of a computer system.

FIGS. 1A and 1B illustrate a block diagram of one embodiment of a computer system 100. Computer system 100 includes a processor 110 coupled to an interconnect 105. In some embodiments, the terms processor and central processing unit (CPU) may be used interchangeably. In one embodiment, processor 110 is a processor in the Pentium® family of processors including the Pentium(D IV processors available from Intel Corporation of Santa Clara, Calif. Alternatively, other processors may be used. In a further embodiment, processor 110 may include multiple processor cores.

In one embodiment, processor 110 includes a ROM 115. In some embodiments, this ROM 115 is an on-die ROM. Typically, data stored in ROM 115 is non-volatile and requires special operations to change the data. Therefore, its main use lies in the distribution of firmware. Firmware is software very closely related to hardware and not likely to need frequent upgrading. In addition, ROM 115 may also be used to hold the control store for the processor 110.

According to one embodiment, interconnect 105 communicates with a control hub 130 component of a chipset 120. In some embodiments, interconnect 105 may be point-to-point or, in other embodiments may be connected to more than two chips. Control hub 130 includes a memory controller 140 that is coupled to a main system memory 145, as depicted in FIG. 1A. In other embodiments, memory controller 140 may be in the same chip as processor 110, as depicted in FIG. 1B.

In some embodiments, the memory controller 140 may work for all cores or processors in the chip. In other embodiments, the memory controller 140 may include different portions that may work separately for different cores or processors in the chip.

Main system memory 145 stores data and sequences of instructions and code represented by data signals that may be executed by processor 110 or any other device included in computer system 100. In one embodiment, main system memory 145 includes dynamic random access memory (DRAM); however, main system memory 145 may be implemented using other memory types. According to one embodiment, control hub 130 also provides an interface to input/output (I/O) devices within computer system 100.

Embodiments of the present invention provide an algorithm for performing a BIST of a ROM. In some embodiments, the ROM may be on-die, referring to a ROM located on a processor or central processing unit (CPU) chip. It should be noted that the ROM BIST algorithm of embodiments of the invention is cyclic redundancy check (CRC)-based. This means that a CRC is used to detect and correct errors after transmission or storage of the data being tested in the ROM. The CRC is computed and appended before transmission or storage, and verified afterwards by the data recipient to confirm that no changes occurred on transit.

FIG. 2 is a flow diagram depicting one embodiment of a method for performing on-die ROM BIST. The method 200 depicts an algorithm to perform an access pattern of a BIST that is applied to a ROM, such as ROM 115 described with respect to FIG. 1. Embodiments of the algorithm include six passes through a memory array of the ROM. This algorithm tests both dynamic and static faults extensively in the ROM. In addition, an interleaved CRC-generation and checking are applied as part of the ROM BIST.

The process 200 of FIG. 2 begins at processing block 210, where the ROM BIST performs two passes for testing odd word line entries of its memory array for static and delay faults. At processing block 220, CRC is applied to the data retrieved from the ROM in each pass to determine whether static and/or delay faults exist. Then, at processing block 230, the ROM BIST performs another two passes for testing even word lines entries of its memory array for static and delay faults. At processing block 240, CRC is applied to the data retrieved from the ROM in each pass to determine whether static and/or delay faults exist.

Then, at processing block 250, the ROM BIST performs a final two passes for testing each entry of its memory array for static faults masked by dynamic faults. The first pass for this testing covers the even word lines, while the second pass covers the odd word lines. At processing block 260, CRC is applied to the data retrieved from the ROM in each pass to determine whether any static faults masked by dynamic faults exist.

One skilled in the art will appreciate that embodiments of the invention are focused on the access pattern to the ROM, rather than the actual testing technique applied to the ROM. A more detailed explanation of each of the testing passes through the ROM memory array is provided below with respect to FIGS. 3 through 8.

For the following description of embodiments of the algorithm in relation to FIGS. 3 through 8, assume that:
  m=number of entries in a ROM
  n=width of an entry, where physical organization is banked
  Physical array organization of ROM is m0×m1×n, where
    m0=# of rows and m1=# of columns
  32-bit CCITT CRC polynomial is used
  Two-way interleaved CRC-generation based on physical array organization is applied
    32-bit CRC computed over all of the bits of the odd word lines and stored in the last entry of the last odd word line
    32-bit CRC computed over all of the bits of the even word lines and stored in the last entry of the last even word line
  A Read Side Test Register (RSTR) and an LSFR used for signature analysis These assumptions are applied to various embodiments of the invention; however one skilled in the art will appreciate that other ROM organization and CRC algorithms may be utilized.

Furthermore, the following equations apply to the description of embodiments of the algorithm in FIGS. 3 through 8:
  $x=\log_2(m)$
  $y=\log_2(m0)$
  $z=\log_2(m1)$
  addreven={EVEN[addr[x-1:z]]} (e.g., addreven[1]=(addr[x-1:z]=2)
  addrodd={ODD[addr[x-1:z]]} (e.g., addrodd[1]=(addr[x-1:z]=3)
  addrz={addr[z-1:0]}

It should be noted that both ODD and EVEN striding is carried out for both the upper and lower adjacent word lines. Embodiments of the algorithm of the invention have two main access operations: (1) Read without Load (RwoL), where data is not taken into the LFSR; and (2) Read with Load (RwL), where data goes into an LFSR and the LFSR state gets updated. However, it should be appreciated that other BIST techniques may be applied with the access pattern described with respect to embodiments of the present invention.

Figure 3:
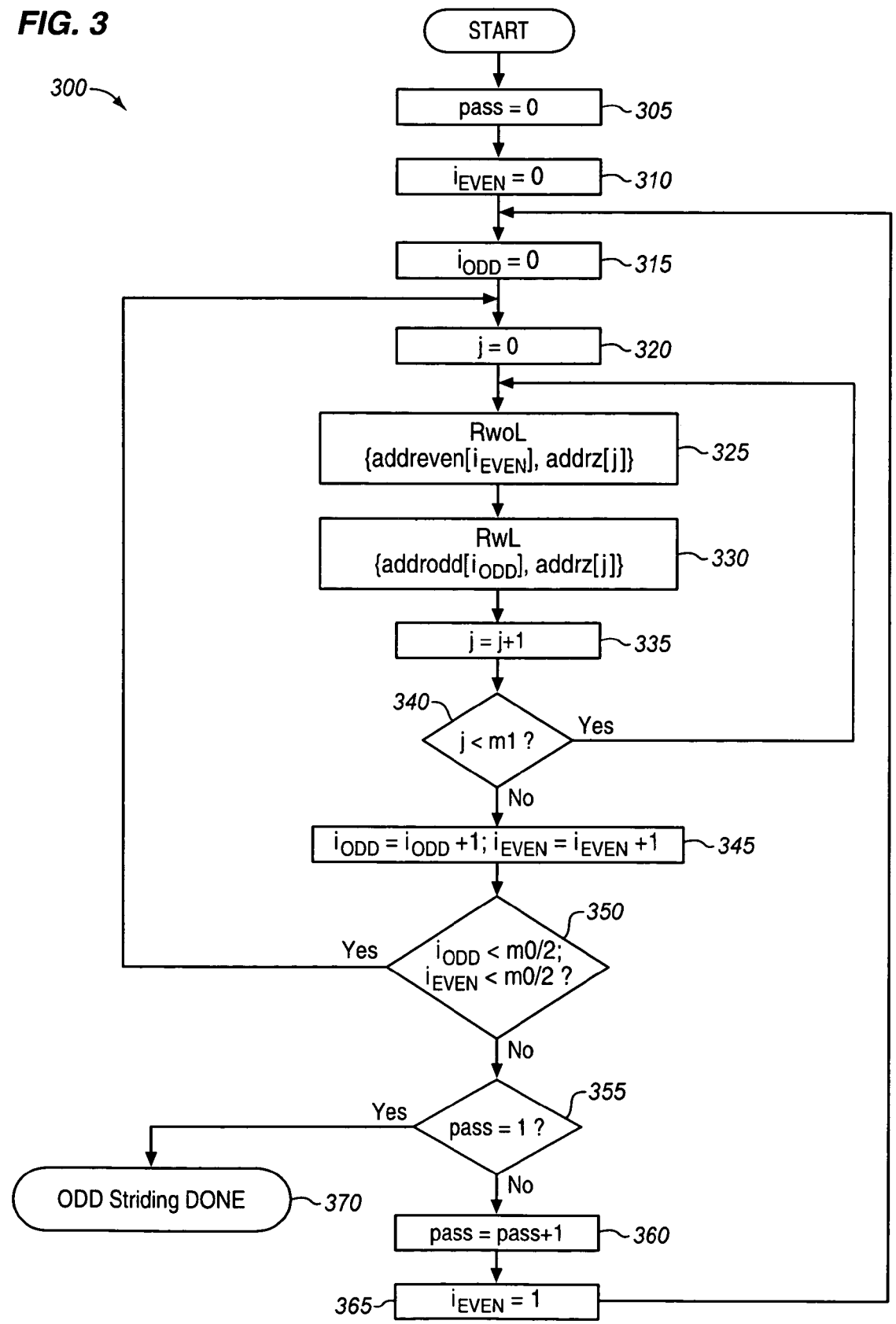
FIG. 3 illustrates a flow diagram of one embodiment of odd word line testing for the ROM BIST.

FIG. 3 is a flow diagram illustrating one embodiment of a process 300 for odd word line testing for a ROM BIST. The process 300 corresponds to processing block 210 described with respect to FIG. 2. For the odd word line entries pass through a ROM, the process 300 begins at processing blocks 305-320 where the values for 'pass', '$i_{EVEN}$', '$i_{ODD}$', and 'j' are set to zero. The 'pass' value tracks which pass through the odd word lines the BIST is performing. The '$i_{EVEN}$' and '$i_{ODD}$' values track the even and odd word lines of the ROM memory array, respectively. The 'j' value tracks the column (i.e., entry value) of the ROM memory array.

At processing block 325, a RwoL is performed on an entry of an even word line. The particular entry and word line are determined by the values of $i_{EVEN}$ and j at that particular iteration. Then, at processing block 330, a RwL is performed on an entry of an odd word line. The particular entry and word line are determined by the values of $i_{ODD}$ and j at that particular iteration.

At processing block 335, the value of j (i.e., the entry value on the word line) is incremented by one. At decision block 340, it is determined whether the value of j is less than m1 (i.e., the number of entries/columns in a word line). If j is less than m1, then the process returns to processing block 325 to repeat the RwoL and RwL on the next entry in the odd and even word lines. If j is greater than or equal to m1, then all of the entries on the particular odd and even word lines being tested have been addressed and the process continues to processing block 345.

At processing block 345, the $i_{EVEN}$ and $i_{ODD}$ values are incremented by 1. This increments the odd and even word lines to be tested by the next iteration. Then, at decision block 350, the values of $i_{EVEN}$ and $i_{ODD}$ are tested to determine whether both are less than the value of m0/2 (i.e., less then half of the number of word lines in the ROM memory array, which is the same as the number of even or odd word lines). If so, the process returns to processing block 320, where the value of j is reset to 0. Then, at processing block 325-340, the RwoL and RwL are repeated for all of the entries of the next odd and even word lines.

If the values of $i_{EVEN}$ and $i_{ODD}$ are greater than or equal to m0/2 (i.e., all word lines have been tested) at decision block 350, then the process continues to decision block 355 where it is determined whether the value of pass is set to 1. If it is equal to 1, then the odd word line testing (i.e., striding) is completed at processing block 370. However, if the pass value is not equal to 1, then the process continues to processing block 360 where the pass value is set to 1. Then, at processing block 365 the value of $i_{EVEN}$ is set to 1. The process returns to processing blocks 315-320, where the values of $i_{ODD}$ and j are reset to 0. The process of processing block 325 through 350 is then repeated for a second pass through the memory array.

By setting the initial value of $i_{EVEN}$ to 1 and $i_{ODD}$ to 0, this second pass through the memory array is able to test the entries on each odd word line from a different approach than the first pass. This concept is further illustrated with respect to FIG. 4 below.

Figure 4:
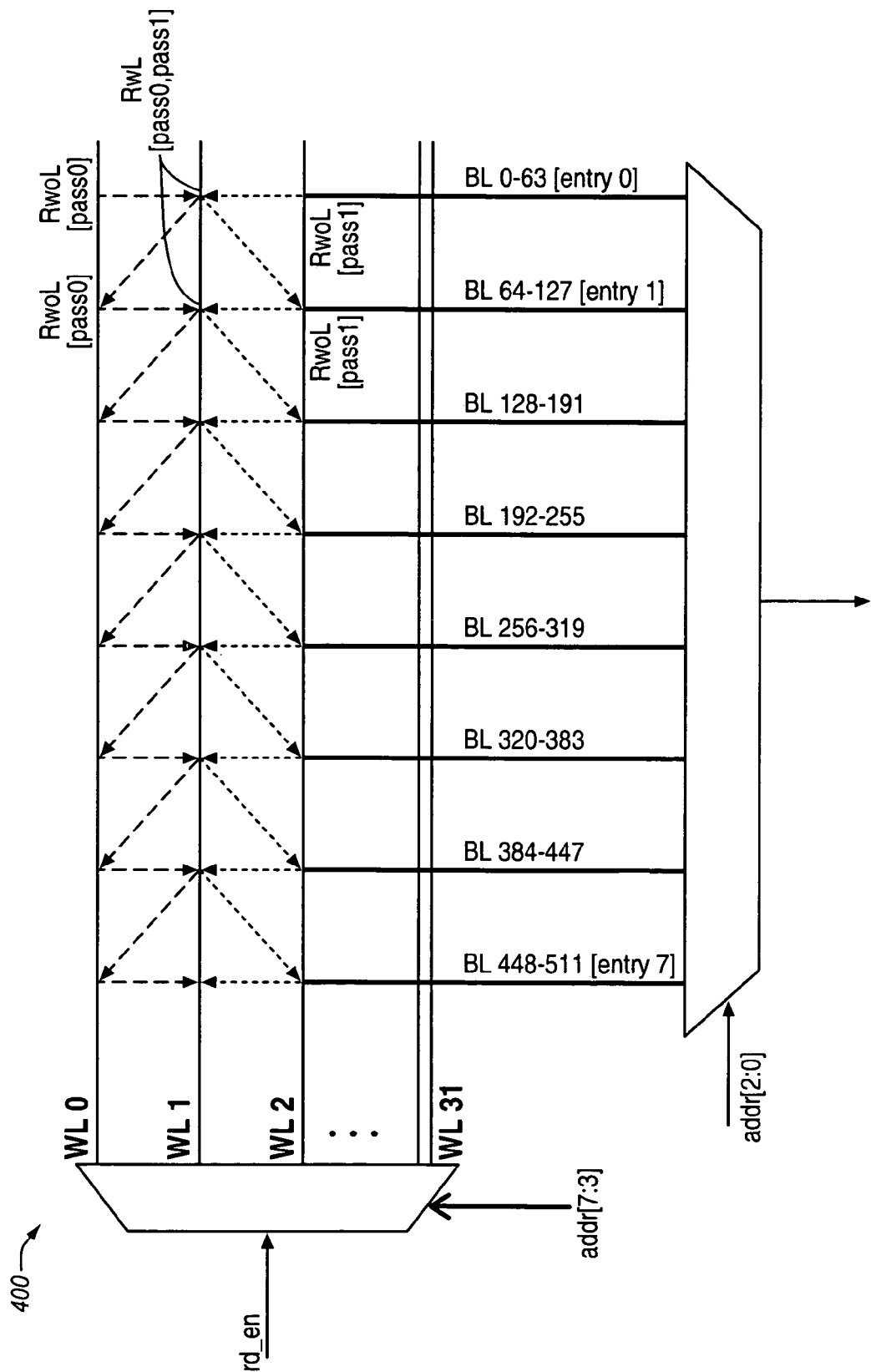
FIG. 4 illustrates a block diagram of one embodiment of application of odd word line testing to a ROM.

FIG. 4 is a block diagram illustrating one embodiment of a trace of the odd word line testing for the ROM BIST. A ROM memory array 400 is shown with the odd word line testing 300 described with respect to FIG. 3 applied to it. Assume for memory array 400 that m=256, n=64, m0=32, and m1=8. However, such values are not required and should be construed as solely an exemplary embodiment of the invention. As shown in FIG. 4, the first pass and the second pass through the ROM memory array 400 are illustrated with different lines.

In the first pass through the memory array 400 (i.e., 'pass'=0 or 'pass0'), the first entry (entry 0) of word line 0 (an even word line) is RwoL. Then, the first entry (entry 8) of word line 1 (an odd word line) is RwL. This continues for each entry of the word lines 0 and 1. This is further repeated for all of the word line entries of ROM memory array 400. For example, the next iteration would RwoL the first entry (entry 16) of word line 2 and then RwL the first entry (entry 24) of word line 3, and so on.

In the second pass through the memory array 400 (i.e., 'pass'=1 or 'pass1'), the first entry of word line 2 is RwoL, and then the first entry of word line 1 is RwL. This continues for each entry of word lines 2 and 1. This is further repeated for all of the word line entries of ROM memory array 400. For example, the next iteration would RwoL the first entry of word line 4 and then RwL the first entry of word line 3.

As can be seen, embodiments of the invention result in the two passes through the memory array 400 testing each entry of the odd word lines with different approaches to the entry for each pass. The first pass approaches the odd word line from the above even word line. The second pass approaches the odd word line from the below even word line. Such an access pattern enables a thorough testing for a variety of faults in the ROM by simulating the particular techniques for reading through a ROM.

Figure 5:
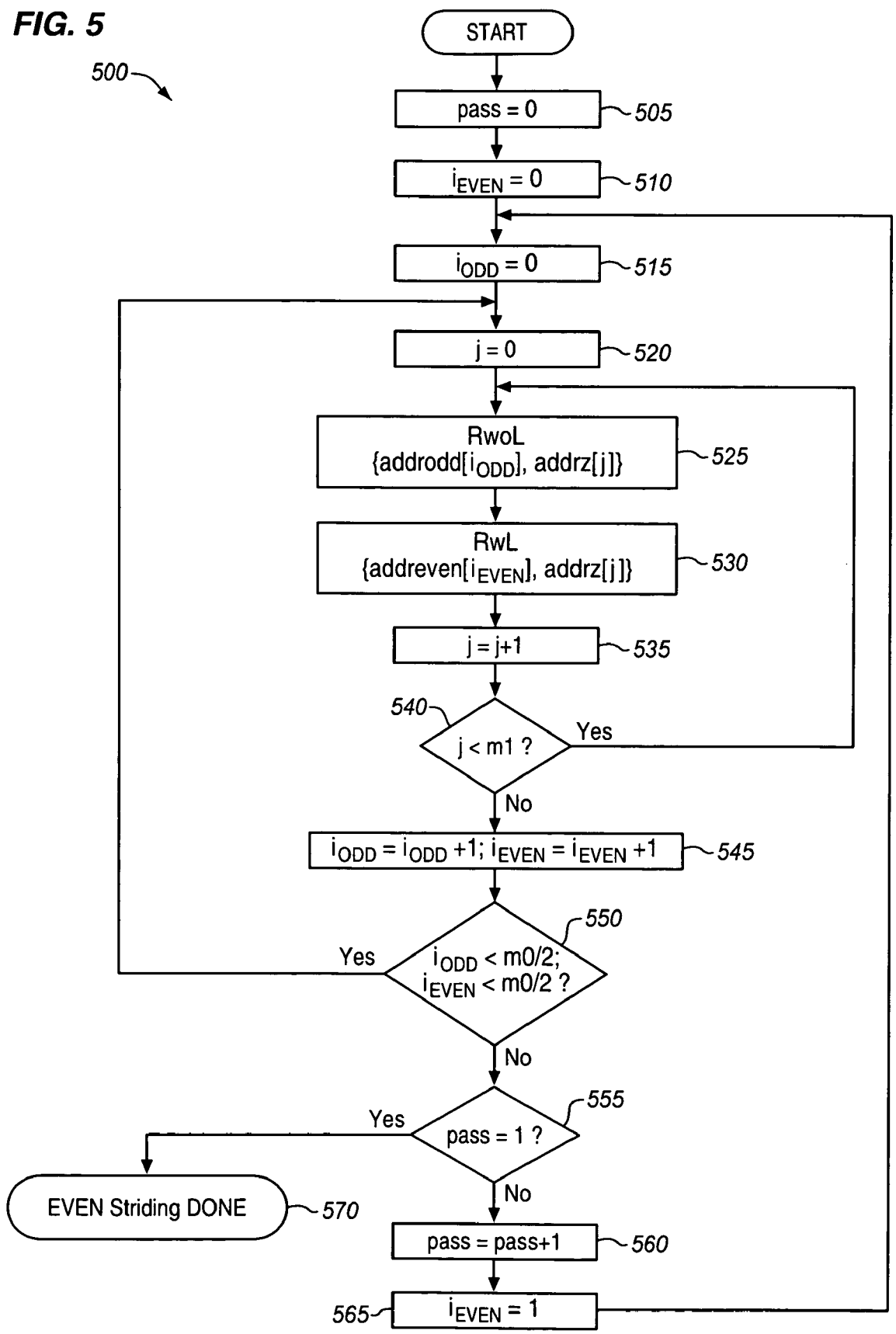
FIG. 5 illustrates a flow diagram of one embodiment of even word line testing for the ROM BIST.

FIG. 5 is a flow diagram illustrating even word line testing for the ROM BIST according to embodiments of the invention. The process 500 corresponds to processing block 230 described with respect to FIG. 2. In some embodiments, the even word lines testing takes places after the passes through the ROM for the odd word line testing. However, the particular order of passes through the ROM is not essential and may occur in any order.

For the even word line entries pass, the process 500 begins at processing blocks 505-520 where the values for 'pass', '$i_{EVEN}$', '$i_{ODD}$', and 'j' are set to zero. These values are the same as those described with respect to FIG. 3. At processing block 525, a RwoL is performed on an entry of an odd word line. The particular entry and word line are determined by the values of $i_{ODD}$ and j at that particular iteration. Then, at processing block 530 a RwL is performed on an entry of an even word line. The particular entry and word line are determined by the values of $i_{EVEN}$ and j at that particular iteration.

At processing block 535, the value of j (i.e., the entry value on the word line) is incremented by one. At decision block 540, it is determined whether the value of j is less than m1 (i.e., the number of entries in a word line). If j is less than m1, then the process returns to processing block 525 to repeat the RwoL and RwL on the next entry in the word lines. If j is greater than or equal to m1, then all of the entries on the word lines have been tested and the process continues to processing block 545.

At processing block 545, the $i_{EVEN}$ and $i_{ODD}$ values are incremented by 1. This increments the odd and even word lines to be tested by the next iteration. Then, at decision block 550, the values of $i_{EVEN}$ and $i_{ODD}$ are tested to determine whether both are less than the value of m0/2 (i.e., less then half of the number of word lines in the ROM memory array, which is the same as the number or even or odd word lines in the ROM). If so, the process returns to processing block 520 where the value of j is reset to 0. Then, at processing block 525-540, the RwoL and RwL are repeated for all of the entries of the next odd and even word lines.

If the values of $i_{EVEN}$ and $i_{ODD}$ are greater than or equal to m0/2 (i.e., all word lines have been tested) at decision block 550, then the process continues to decision block 555 where it is determined whether the value of pass is set to 1. If it is equal to 1, then the even word line testing (striding) is completed at processing block 570. However, if the pass value is not equal to 1, then the process continues to processing block 560 where the pass value is set to 1. Then, at processing block 565 the value of $i_{EVEN}$ is set to 1. The process returns to processing blocks 515-520, where the values of $i_{ODD}$ and j are reset to 0. The process of processing block 525 through 550 is then repeated for a second pass through the memory array.

By setting the initial value of $i_{EVEN}$ to 1 and $i_{ODD}$ to 0, this second pass through the memory array is able to test the entries on each even word line from a different approach than the first pass. This concept is further illustrated with respect to FIG. 6 below.

Figure 6:
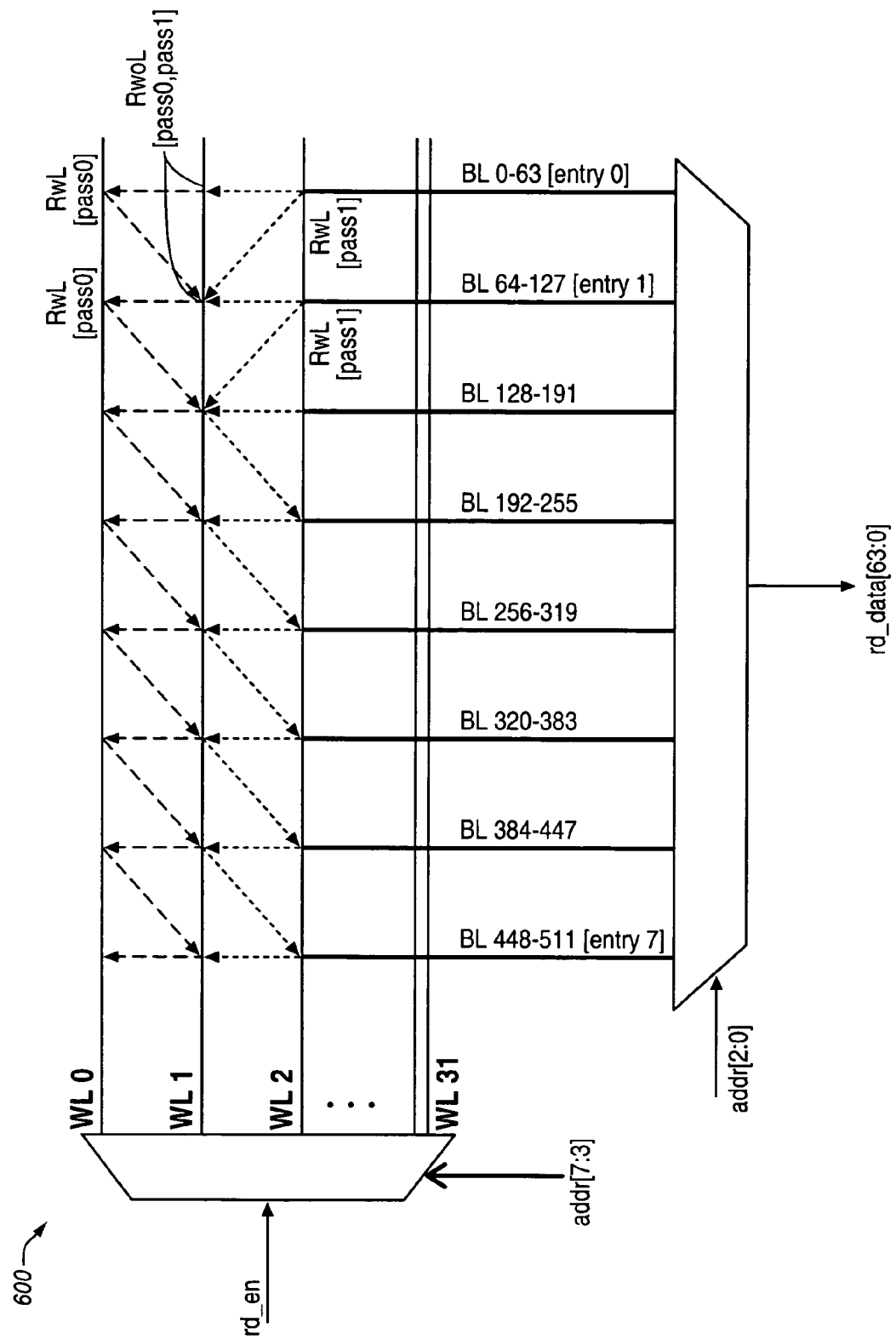
FIG. 6 illustrates a block diagram of one embodiment of application of even word line testing to a ROM.

FIG. 6 is a block diagram illustrating one embodiment of a trace of the even word line testing for the ROM BIST. A ROM memory array 600 is shown with the even word line testing 500 described with respect to FIG. 5 applied to it. The trace through ROM memory array 600 that is depicted is similar to the trace shown in FIG. 4, except that the stressed word line entry is an even word line. Assume that for memory array 600, m=256, n=64, m0=32, and m1=8. However, such values are not required and should be construed as solely an exemplary embodiment of the invention. As shown in FIG. 6, the first pass and the second pass through the ROM memory array 400 are illustrated with different lines.

In the first pass through the memory array 600 (i.e., 'pass'=0 or 'pass0'), the first entry (entry 8) of word line 1 (odd word line) is RwoL. Then, the first entry (entry 0) of word line 0 (even word line) is RwL. This continues for each entry of the word lines 1 and 0. This is further repeated for all of the word line entries of ROM memory array 600. For example, the next iteration would RwL the first entry (entry 24) of word line 3 and then RwL the first entry (entry 16) of word line 2, and so on.

In the second pass through the memory array 600 (i.e., 'pass'=1 or 'pass1'), the first entry of word line 1 is RwoL. Then, the first entry of word line 2 is RwL. This continues for each entry of word lines 1 and 2. This is further repeated for all the word line entries of ROM memory array 600. For example, the next iteration would RwoL the first entry of word line 3 and then RwL the first entry of word line 4.

As can be seen, embodiments of the invention result in the two passes through the memory array 600 testing each entry of the even word lines with different approaches to the entry for each pass. The first pass approaches the even word line from the below odd word line. The second pass approaches the even word line from the above odd word line. Such an access pattern enables a thorough testing for a variety of faults in the ROM by simulating the particular techniques for reading through a ROM.

Figure 7:
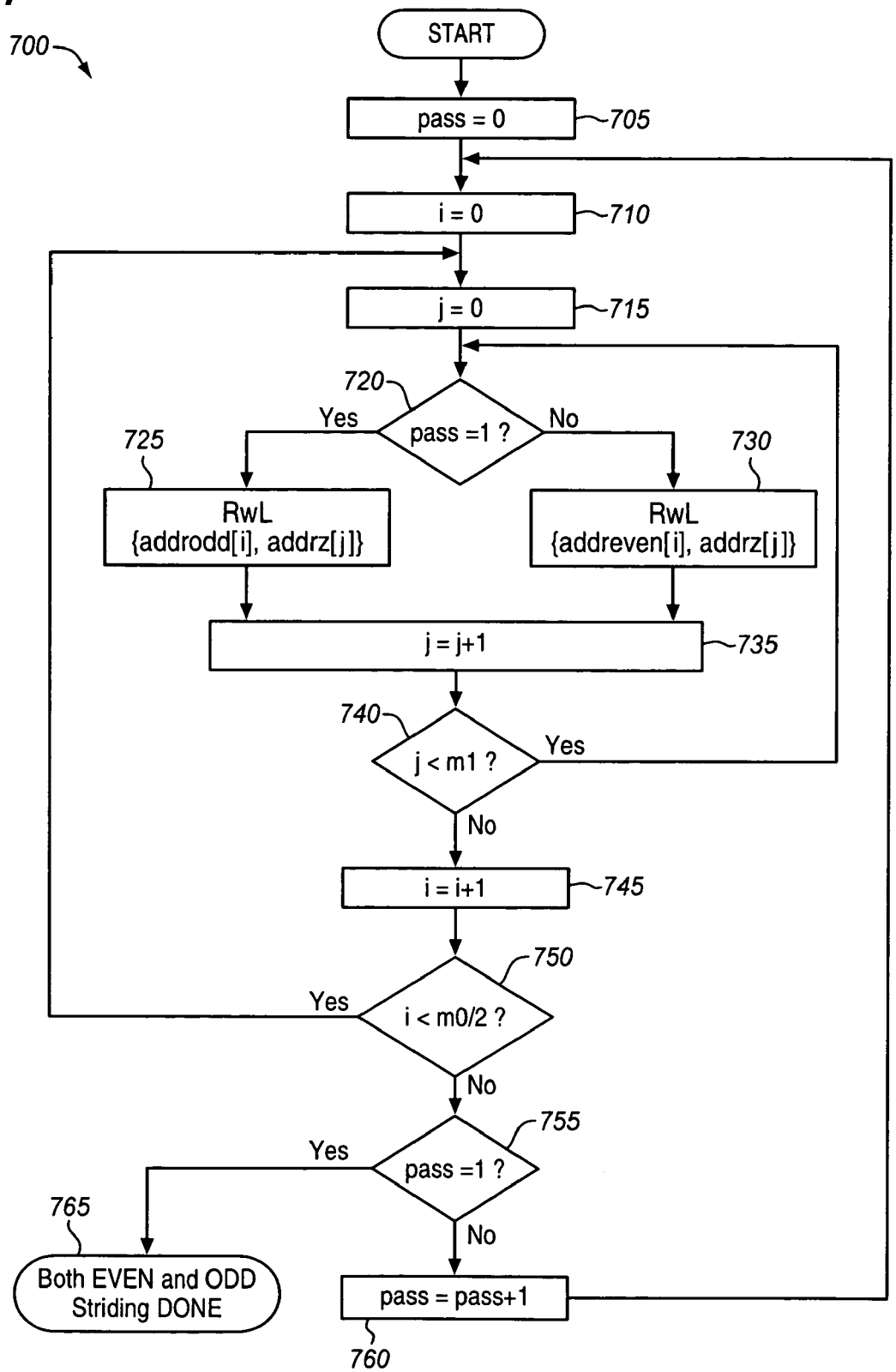
FIG. 7 illustrates a flow diagram of one embodiment static faults masked by dynamic faults testing for the ROM BIST.

FIG. 7 is a flow diagram illustrating one embodiment of static faults masked by dynamic faults testing for the ROM BIST. The process 700 corresponds to processing block 250 described with respect to FIG. 2. In some embodiments, the static masked by dynamic fault entry testing takes places after the passes through the ROM for the odd 210 and even 230 word line testing. However, the particular order of passes through the ROM is not essential and may occur in any order.

For the static masked by dynamic fault passes, the process 700 begins at processing blocks 705-715 where the values for 'pass', 'i', and 'j' are set to zero. These values are the same as those described with respect to FIGS. 3 and 5, with the addition of the value 'i' representing the particular word line of the ROM memory array with no reference to either odd or even lines.

At decision block 720, it is determined whether the pass value is equal to 1. If not, then the even word lines are being tested. Therefore, at processing block 730, a RwL is performed on an entry of an even word line. The particular entry and word line are determined by the values of i and j at that particular iteration.

At processing block 735, the value of j is incremented by 1. At decision block 740, it is determined whether the value of j is less than m1 (i.e., the number of entries in a word line). If j is less than m1, then the process returns to processing block 720 to repeat the RwL on the next entry in the same word line previously tested. If j is greater than or equal to m1, then all of the entries on the word line have been tested and the process continues to processing block 745.

At processing block 745, the value of i is incremented by 1, thereby incrementing to the next word line to be tested. At decision block 750, it is determined whether i is less than m0/2 (i.e., the number of even or odd word lines in the memory array). If so, the process returns to processing block 720 where the value of j is reset to 0. Then, at processing block 730-750, the RwL is repeated for all of the entries of the next word line to be tested.

If the value of i is greater than or equal to m0/2 (i.e., all even or odd word lines have been tested) at decision block 750, then the process continues to decision block 755 where it is determined whether the value of pass is equal to 1. If it is equal to 1, then the even and odd word line testing (striding) is completed at processing block 765.

However, if the pass value is not equal to 1, then the process continues to processing block 760 where the pass value is set to 1. Then, the process returns to processing blocks 710 and 715, where the values of i and j are reset to 0. The process of processing block 720 through 750 is then repeated for a second pass through the memory array. This second pass performs a RwL at processing block 725 for all of the odd word lines of the memory array.

Figure 8:
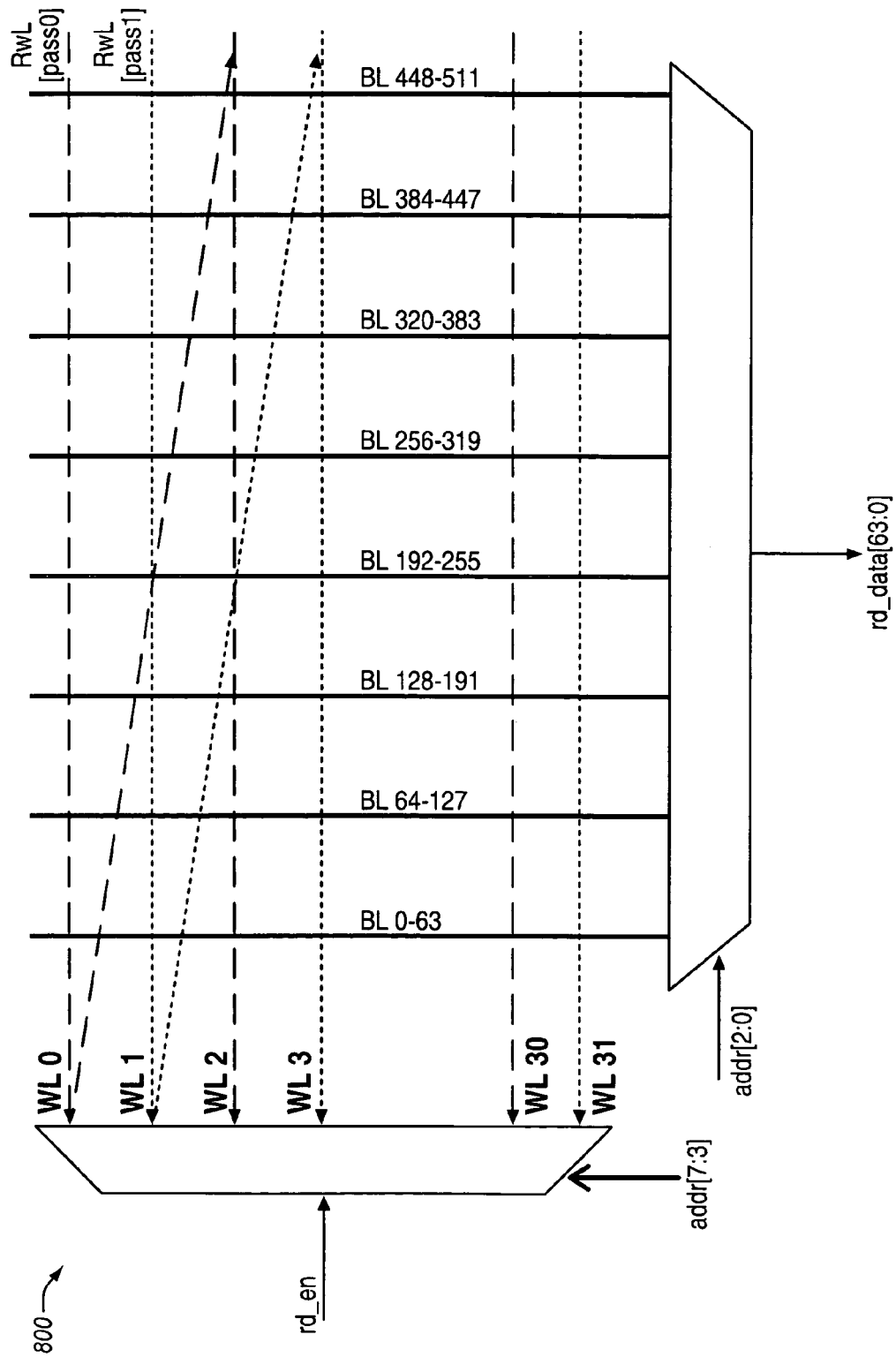
FIG. 8 illustrates a block diagram of one embodiment of application of static faults masked by dynamic faults testing to a ROM.

FIG. 8 is a block diagram illustrating one embodiment of a trace of the static faults masked by dynamic faults testing for the ROM BIST. A ROM memory array 800 is shown with the static masked by dynamic testing 700 described with respect to FIG. 7 applied to it. Assume for memory array 800 that m=256, n=64, m0=32, and m1=8. However, such values are not required and should be construed as solely an exemplary embodiment of the invention. As shown in FIG. 8, the first pass and the second pass through the ROM memory array 400 are illustrated with different lines.

In the first pass through the memory array 800 (i.e., 'pass'=0 or 'pass0'), the even word line adjacent entries are tested. The testing begins with a RwL of the first (entry 0) of word line 0 (an even word line). Then, a RwL of the second entry (entry 1) of word line 0 is performed, and so on for each entry of word line 0. This is repeated for all the even word line entries of ROM memory array 800. For example, in the next iteration, the first entry (entry 16) of word line 2 is RwL and then the second entry (entry 17) of word line 2 is RwL, and so on.

In the second pass through the memory array 800 (i.e., 'pass'=1 or 'pass1'), the first entry (entry 8) of word line 1 (odd word line) is RwL, and then the second entry (entry 9) of word line 1 is RwL, and so on for each entry of word line 1. This is repeated for all the odd word line entries of ROM memory array 800. For example, in the next iteration, the first entry (entry 24) of word line 3 is RwL and then the second (entry 25) of word line 3 is RwL, and so on.

Figure 9:
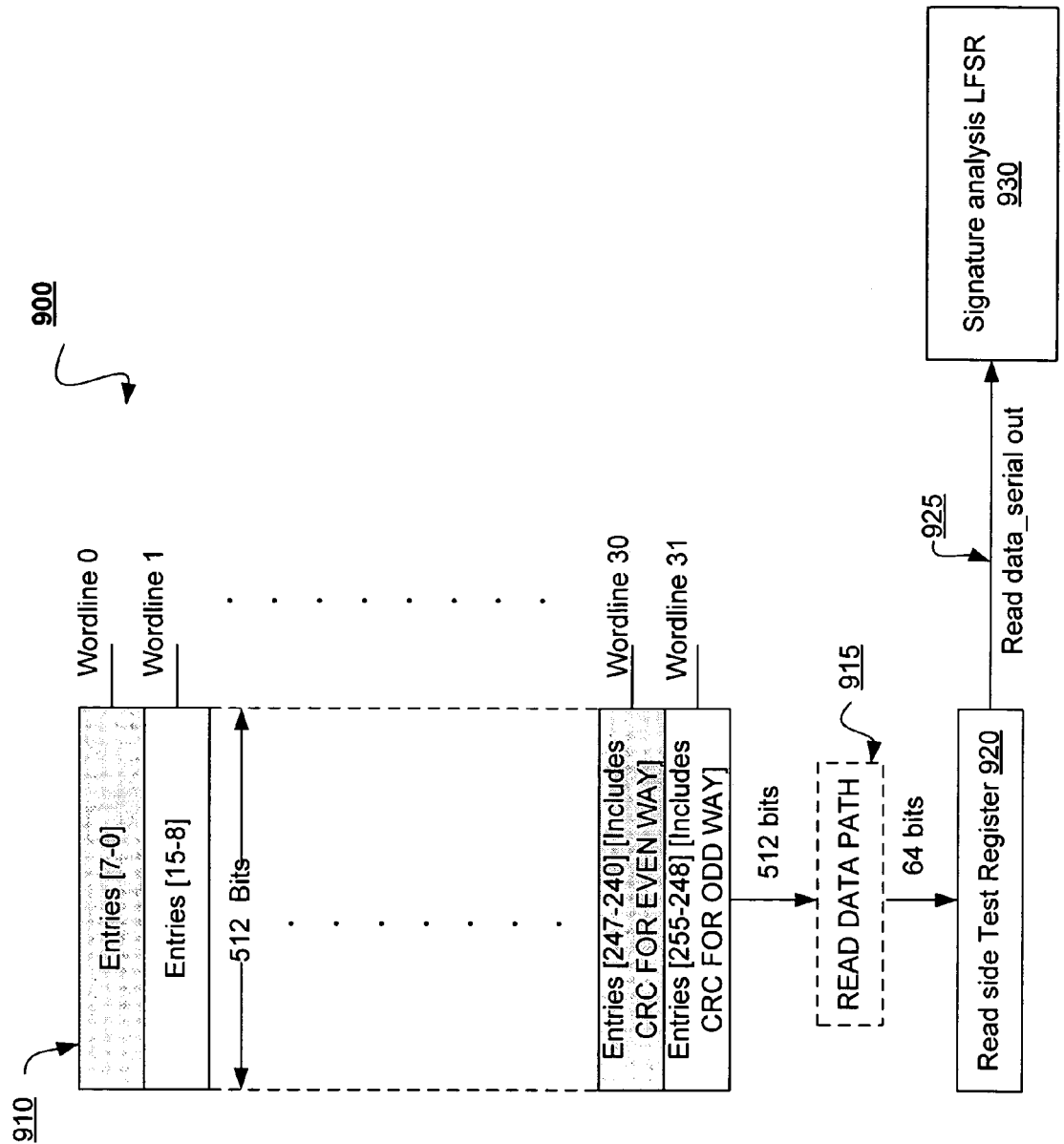
FIG. 9 is a block diagram illustrating a hardware implementation of a ROM according to embodiments of the present invention.

FIG. 9 is a block diagram illustrating a hardware implementation of a ROM according to embodiments of the present invention. System 900 is the same as those illustrated with respect to FIGS. 4, 6, and 8. ROM 910 may implement a BIST as described above with respect to FIGS. 2 through 8. As shown, ROM 910 includes 32 word lines labeled as word lines 0 through 31. These word lines are either even or odd word lines which are tested according to the various access patterns detailed above. Word lines 30 and 31 each include the CRC for the even or odd ways, respectively.

The CRC value in word line 30 is computed during the even passes through the ROM, where the even word lines are stressed. The CRC value in word line 31 is computed during the odd passes through the ROM, where the odd word lines are stressed. The CRC values are fed to a read side test register (RSTR) 920, which is a simple shift register used for CRC, over the read data path 915. Then, signature analysis of the CRCs is performed by signature analysis in LFSR 930 to determine faults. In some embodiments, data from the RSTR 920 is read out in a serial fashion over line 925 to signature analysis LFSR 930.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A method, comprising:
   testing odd word line entries of a read-only memory (ROM) array by performing two passes through the ROM array to test each odd word line entry for static and delay faults;
   testing even word line entries of the ROM array by performing two passes through the ROM array to test each even word line entry for static and delay faults; and
   testing each entry of the ROM array for static faults masked by dynamic faults by performing two passes through the ROM array.

2. The method of claim 1, wherein the testing utilizes cyclic redundancy check (CRC) generation.

3. The method of claim 2, wherein the CRC generation is a two-way interleaved generation with the odd word line entries belonging to a first CRC protection domain and the even word line entries belonging to a second CRC protection domain.

4. The method of claim 1, wherein testing odd word lines further comprises performing a read with load of each odd word line entry and a read without load of each even word line entry, a read with load to present an entry for signature analysis and a read without load to bypass an entry for signature analysis.

5. The method of claim 1, wherein testing even word lines further comprises performing a read with load of each even word line entry and a read without load of each odd word line entry, a read with load to present an entry for signature analysis and a read without load to bypass an entry for signature analysis.

6. The method of claim 1, wherein each pass of the two passes of both of the odd word line testing and even word line testing approaches each entry to be tested on the word line from a different location.

7. The method of claim 1, wherein a first pass for testing static faults masked by dynamic faults tests entries of odd word lines, and a second pass for testing static faults masked by dynamic faults tests entries of even word lines.

8. The method of claim 7, wherein the static faults are stuck at faults including at least one of a stuck-at cell fault, stuck-at word line fault, stuck-at bit line fault, stuck-at address input line fault, stuck-at decoder fault, and mixed stick-at fault.

9. An apparatus, comprising:
   a read-only memory (ROM) including a built-in self-test (BIST), the BIST to:
      test odd word line entries of a read-only memory (ROM) array by performing two passes through the ROM array to test each odd word line entry for static and delay faults;
      test even word line entries of the ROM array by performing two passes through the ROM array to test each even word line entry for static and delay faults; and
      test each entry of the ROM array for static faults masked by dynamic faults by performing two passes through the ROM array.

10. The apparatus of claim 9, wherein the testing by the BIST utilizes cyclic redundancy check (CRC) generation.

11. The apparatus of claim 10, wherein the CRC generation is a two-way interleaved generation with the odd word line entries belonging to a first CRC protection domain and the even word line entries belonging to a second CRC protection domain.

12. The apparatus of claim 9, wherein:
   testing odd word lines further comprises performing a read with load of each odd word line entry and a read without load of each even word line entry; and
   testing even word lines further comprises performing a read with load of each even word line entry and a read without load of each odd word line entry;
   wherein a read with load to present an entry for signature analysis and a read without load to bypass an entry for signature analysis.

13. The apparatus of claim 9, wherein each pass of the two passes of both of the odd word line testing and even word line testing approaches an entry to be tested on the word line from a different location.

14. The apparatus of claim 9, wherein a first pass for testing static faults masked by dynamic faults tests entries of odd word lines, and a second pass for testing static faults masked by dynamic faults tests entries of even word lines.

15. The apparatus of claim 14, wherein the static faults are stuck at faults including at least one of a stuck-at cell fault, stuck-at word line fault, stuck-at bit line fault, stuck-at address input line fault, stuck-at decoder fault, and mixed stick-at fault.

16. A system, comprising:
   a central processing unit (CPU) coupled with a read-only memory (ROM);
   a read side test register (RSTR) coupled to the ROM; and
   a linear feedback shift register (LFSR) coupled to the RSTR;
   the ROM including a built-in self-test (BIST) to:
      test odd word lines of an array of the ROM by performing two passes through the ROM array to test each odd word line entry for static and delay faults;
      test even word lines of the ROM array by performing two passes through the ROM array to test each even word line entry for static and delay faults; and
      test each entry of the ROM array for static faults masked by dynamic faults by performing two passes though the ROM array.

17. The system of claim 16, wherein the testing by the BIST utilizes cyclic redundancy check (CRC) generation to create a signature of the word line entries for the LFSR to analyze for fault detection.

18. The system of claim 17, wherein the CRC generation is a two-way interleaved generation with the odd word line entries belonging to a first CRC protection domain and the even word line entries belonging to a second CRC protection domain.

19. The system of claim 16, wherein:
   testing odd word lines further comprises performing a read with load of each odd word line entry and a read without load of each even word line entry; and
   testing even word lines further comprises performing a read with load of each even word line entry and a read without load of each odd word line entry;
   wherein a read with load to present an entry for signature analysis and a read without load to bypass an entry for signature analysis.

20. The system of claim 16, wherein a first pass for testing static faults masked by dynamic faults tests entries of odd word lines, and a second pass for testing static faults masked by dynamic faults tests entries of even word lines.

* * * * *